(12) United States Patent
Yap et al.

(10) Patent No.: US 6,229,189 B1
(45) Date of Patent: May 8, 2001

(54) MULTI-FUNCTION OPTOELECTRONIC DEVICE STRUCTURE

(75) Inventors: Daniel Yap, Thousand Oaks; Daniel Docter, Santa Monica; William Stanchina, Thousand Oaks, all of CA (US)

(73) Assignee: Hughes Electronics Corporation, El Segundo, CA (US)

( * ) Notice: Subject to any disclaimer, the term of this patent is extended or adjusted under 35 U.S.C. 154(b) by 0 days.

(21) Appl. No.: 09/222,612

(22) Filed: Dec. 24, 1998

(51) Int. Cl.[7] .................................................. H01L 27/14
(52) U.S. Cl. .............................. 257/414; 257/80; 257/81; 257/83; 257/84; 257/431; 438/22; 438/24
(58) Field of Search .................................. 257/80, 83, 84, 257/81, 414, 431; 438/22, 24

(56) References Cited

U.S. PATENT DOCUMENTS

| | | | |
|---|---|---|---|
| 5,260,586 | * 11/1993 | Kondo et al. | 257/84 |
| 5,376,185 | * 12/1994 | Wanlass | 136/262 |
| 5,764,826 | * 6/1998 | Kuhara et al. | 385/24 |
| 5,811,838 | * 9/1998 | Inomoto | 257/80 |

* cited by examiner

*Primary Examiner*—Eddie C. Lee
*Assistant Examiner*—Matthew E. Warren
(74) *Attorney, Agent, or Firm*—T. Gudmestad

(57) ABSTRACT

An optoelectronic device has an epitaxial layer structure that has a substrate and a first layer formed adjacent to the substrate. The first layer may, for example, form a contact layer. A second layer is formed adjacent to the first layer. The second layer forms a selectively optically varying layer, so that during a first state the second layer is optically absorbing and during a second state the layer is optically transparent. A third layer is formed adjacent to the second layer. A fourth layer is formed adjacent to the third layer. The fourth layer is an optically transparent layer. An optoelectronic device and an electronic device may be formed on the same substrate that share the same layers. The layers used depends upon the devices formed.

18 Claims, 1 Drawing Sheet

MULTI-FUNCTION OPTOELECTRONIC DEVICE STRUCTURE

TECHNICAL FIELD

The present invention relates generally to a multi-function semi-conductor device. More specifically, the present invention relates to a monolithic device having both an optoelectronic (OE) and an electronic device sharing certain layers.

BACKGROUND ART

Circuits that combine optoelectronic (OE) and electronic devices have applications in communication (e.g. as transmitters and receivers for optical fiber based links or for free-space interconnections). Such circuits also are used to form optoelectronic switched networks in applications such as photonic beam forming for phased-array antennas. Switched networks are also used for multi-sensor and multi-processor systems, multi-channel radar imaging, high speed data routing, and digital beam forming.

Commonly, circuits that combine OE and electronic devices are formed of a number of separate components manufactured separately and combined in a hybrid-packaged assembly. Such assemblies have the deficiencies of degraded performance due to packaging parasites. In addition, there is additional cost that results from the hybrid assembly procedures. Monolithic circuits, in which the OE and electronic devices are formed on a common substrate, have been developed as an alternate to the hybrid packaging and assemblies.

One known monolithic optoelectronic receiver is based on a standard, single-heterojunction bipolar transistor (HBT). In this approach, the collector of the standard HBT also serves as the light-absorbing layer of the photodetector. The base, collector and subcollector layers are all fabricated from the smallest bandgap material of the overall structure. This results in these layers being optically absorbing. In the known example, InGaAs is used. One problem with this approach is that only receivers and not transmitters, modulators or optoelectronic switches may be fabricated. This is due to the unattenable characteristics of the optically absorbing layers.

Other known devices have optoelectronic modulators and detectors that have been pseudo-monolithically integrated with transistors. These devices are heterostructure field effect transistors. The modulator and photodetector of such devices have multiple-quantum well structures. The only epitaxial layer that the electronic and optoelectronic devices have in common is the top layer and, thus, are only minimally monolithically integrated. One problem with such devices is that the devices have low current driving capabilities. Another drawback of such devices is that high-resolution photolithography is used to form the gate structure. High resolution photolithography is an expensive process.

Another known heterojunction phototransistor uses a light absorbing layer that is part of the collector. The light absorbing layer has a smaller bandgap than the emitter, base and subcollector layers. The light absorbing layer is intentionally kept thin so as not to degrade the performance of the transistor. One problem with such device is that because the light absorbing layer is so thin, a multi-layer reflector underneath the subcollector is needed to create a resonant optical cavity to enhance the photo sensitivity.

SUMMARY OF THE INVENTION

It is a general object of the invention to fabricate a monolithic epitaxial layered optoelectronic and electronic device that share the same epitaxial layers.

In one aspect of the invention, epitaxial layer structure has a substrate and a first layer formed adjacent to the substrate. The first layer may, for example, form a contact layer. A second layer is formed adjacent to the first layer. The second layer forms a selectively optically varying layer, so that during a first state the second layer is optically absorbing and during a second state the layer is optically transparent. A third layer is formed adjacent to the second layer. A fourth layer is formed adjacent to the third layer. The fourth layer is an optically transparent layer. An optoelectronic device and an electronic device may be formed on the same substrate that share the same layers.

One advantage of the invention is that the simpler fabrication procedure results in higher fabrication yield lowering ultimate cost. A further advantage of the invention is that by forming the subcollector layer to be optically non-absorbing, the optoelectronic device may be an optoelectronic modulator or optical waveguide coupled device.

The present invention thus makes possible compact optoelectronic circuits and switch networks. Since both the photoreceiver and transmitter may be fabricated on the same chip.

Other objects and features of the present invention will become apparent when viewed in light of the detailed description of the preferred embodiment when taken in conjunction with the attached drawings and appended claims.

BEST MODE(S) FOR CARRYING OUT THE INVENTION

The present invention will be described in relation to three specific examples of optoelectronic and electronic devices that are formed from the same monolithic epitaxial layers. However, one skilled in the art would recognize various alternative structures that may be formed according to the teachings set forth herein.

Figure 1:
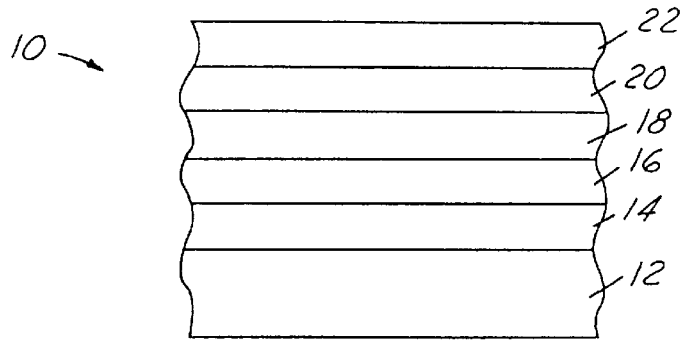
FIG. 1 is a partial cross-sectional view of the epitaxial structure of an optoelectronic device.

Referring now to FIG. 1, an epitaxial layer structure 10 for forming an optoelectronic device is illustrated. The structure 10 is preferably fabricated from Indium Phosphide-based (InP-based) III–V semi-conducting materials. One skilled in the art would recognize that such structures may also be formed from Gallium Arsenide-based (GaAs-based) or Sb-based materials.

Epitaxial layer structure 10 preferably has five layers in addition to substrate 12. That is, a first layer 14, a second layer 16, a third layer 18, a fourth layer 20, and a fifth layer 22 may all be consecutively layered from substrate 12. As will be further described below, depending on the optoelectronic device and electronic device to be fabricated, the presence, doping level, and thickness of each layer may be modified to provide suitable characteristics for the electronic or optoelectronic device.

First layer 14 is preferably a heavily doped N-type InP contact layer. First layer 14 has a doping level greater than $10^{18}$ cm$^{-3}$. The thickness of first layer 14 is preferably greater than 0.2 µm. First layer 14 is transparent to the optical wavelength used for the optoelectronic device.

As will be further described below, first layer 14 may be a sub-collector of a bipolar transistor. First layer 14 may also serve as the cathode of a diode.

Second layer 16 is preferably a very lightly doped N-type layer. Second layer 16 has a doping layer less than $10^{17}$ cm$^{-3}$. The thickness of second layer 16 is preferably between about 0.5 and 1.0 µm.

Second layer 16 has an optical bandgap suitable for selectable absorption of the optical wavelength of the optoelectronic device.

Second layer 16 may serve as the collector of a bipolar transistor. Second layer 16 may also serve as the absorbing layer of a photo-transistor, a photodetector, or a modulator. Further, second layer 16 may also serve as the intrinsic layer of an RF switch.

Second layer 16 is preferably formed from InGaAsP or InGaAlAs. These materials are preferably lattice-matched to InP.

In the preferred embodiment, third layer 18 is a P-type layer that is heavily doped. Third layer 18 is an InGaAs layer doped to a level greater than $10^{19}$ cm$^{-3}$. The thickness of third layer 18 is preferably significantly less than 0.1 µm.

Third layer 18 may serve as the base of a bipolar transistor or as the anode of a diode.

Fourth layer 20 is a moderately doped N-type layer. Suitable compositions for fourth layer 20 is InAlAs or InP. Preferably, fourth layer 20 is doped to around $10^{19}$ to $10^{17}$ cm$^{-3}$. The thickness of fourth layer 20 is preferably about 0.2 µm. Fourth layer 20 is transparent at the optical wavelength used in the application.

Fourth layer 20 may serve as the wide-bandgap emitter of a heterojunction bipolar transistor.

Fifth layer 22 is a heavily doped N-type contact layer. In the preferred embodiment, fifth layer 22 is formed of InGaAs. The doping level is about $10^{19}$ cm$^{-3}$. The thickness of fifth layer 22 is less than 0.1 µm.

In addition to first layer 14 through fifth layer 22, which will be referred to as the primary layers, secondary layers may also be included in structure 10. The secondary layers (not illustrated) may be placed at the interfaces between the primary layers. The secondary layers may be used to achieve a gradual transition in the conduction or valance bands of the primary layers. Secondary layers may also be used to facilitate the fabrication of devices and circuits or control the diffusion of the dopants.

The epitaxial layer structure 10 is similar to a double-heterojunction bipolar transistor (DHBT). However, first layer 14, second layer 16, and fourth layer 20 have a specific relation to the optical wavelength used in the application. Third layer 18 and fifth layer 22 absorb only a minimal amount of optical energy. That is, by making third layer 18 and fifth layer 22 very thin or by removing the layers in the fabrication process, minimal absorption can be achieved. Minimal absorption may also be achieved by increasing the bandgap of third layer 18 to make third layer 18 transparent.

Second layer 16 may also be engineered by forming multiple quantum wells to enhance the electric-field dependent absorption or the light emission efficiency.

Other variations of the doping levels and thicknesses of the primary layers would be evident to those skilled in the art. Depending on the characteristics desired for the optoelectronic device and for the electronic devices, characteristics such as transistor gain and speed, photodetector responsivity, modulation voltage and optical insertion losses are all considerations for a multiple device structure.

Figure 2:
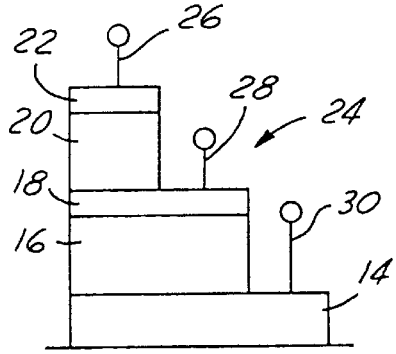
FIG. 2 is a cross-sectional view of double-heterojunction bipolar transistor.

Referring now to FIG. 2, a double-heterojunction bipolar transistor 24 is one example of an electronic device that may be formed according to the present invention. In this device, fourth layer 20 is the emitter of the transistor, third layer 18 is used as the base of the transistor, second layer 16 is the collector, and first layer 14 is used as the subcollector of the transistor. This device is a non-optical device.

Fifth layer 22 is an emitter contacting layer and has an emitter terminal 26 coupled thereto. Third layer 18 has a base terminal 28. First layer 14 has a collector terminal 30. The terminals are used to electrically couple the devices to other devices and voltage sources.

Figure 3:
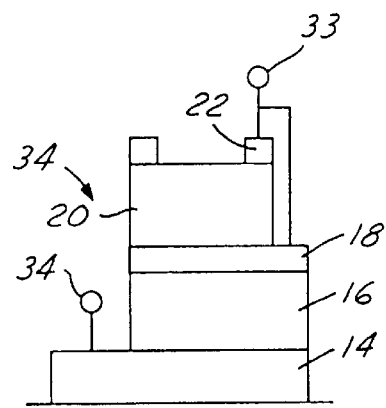
FIG. 3 is a cross-sectional view of a surface normal photodetector formed according to the present invention.

Referring now to FIG. 3, a surface normal photodetector 31 is illustrated. First layer 14 and third layer 18 form a PIN diode. When the device is used as a photodetector, second layer 16 is optically absorbing. A reversed bias electric field sweeps any photo-generated carriers into the anode or the cathode (depending on the polarity). Third layer 18, possibly in combination with fifth layer 22, acts as an anode. First layer 14 acts as a cathode.

Third layer 18 has an anode terminal 33 coupled thereto. First layer 14 has a cathode terminal 34 coupled thereto. Terminals 33 and 34 electrically couple the device to other devices.

Figure 4:
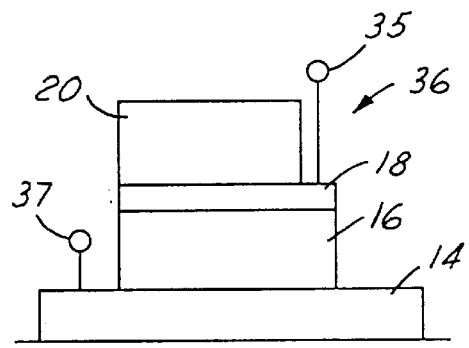
FIG. 4 is a waveguide-coupled modulator formed according to the present invention.

Referring now to FIG. 4, a waveguide modulator 36 is illustrated. Third layer 18 has an anode terminal 35 coupled thereto. First layer 14 has a cathode terminal 37 coupled thereto.

Second layer 16 is optically transparent when no reverse bias is applied. When a sufficient reverse bias electric field is applied across second layer 16, second layer 16 changes from being optically transparent to optically absorbing. Thus, light traveling through the modulator can be modulated in response to the bias voltage.

A waveguide is formed because second layer 16 and third layer 18 have a higher optical refractive index than the surrounding layers. Second layer 16 and third layer 18 act as a waveguide core. First layer 14 and fourth layer 20 have a lower refractive index than second layer 16 and third layer 18. Therefore, first layer 14 and fourth layer 20 act as the waveguide cladding. Commonly, fifth layer 22 is either removed or is designed not to interfere with the waveguiding aspects of the device.

Another device that can be formed is a light emitter. By forming the bandgap layer of second layer 16 smaller than first layer 14, third layer 18, and fourth layer 20, and by forward biasing the diode formed between first layer 14 and third layer 18, a light emitter can be achieved.

Yet another device capable of being formed is an RF switch. RF switch may be constructed from first layer 14, second layer 16, and third layer 18. An RF switch operates similarly to modulator described above except the bias voltage is not necessarily modulated.

Other devices may be fabricated by etching specific features such as mesas and ridges. Local electrical connections can then be made to the specific layers.

Figure 5:
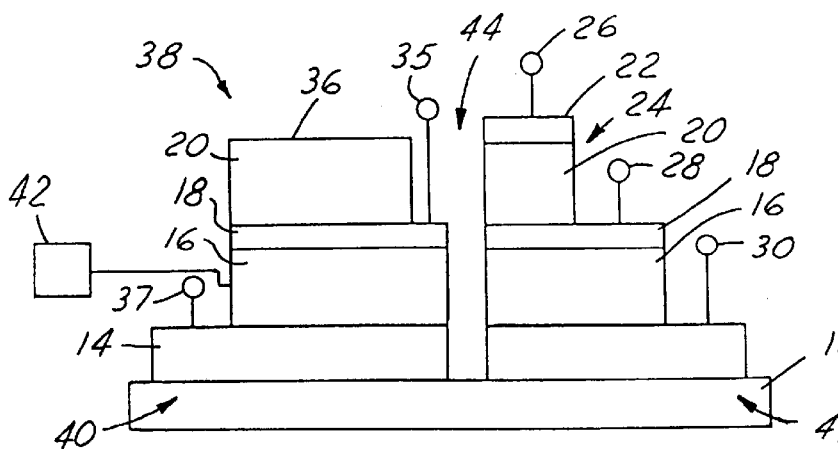
FIG. 5 is a cross-sectional view of a circuit assembly having an electronic device and an optoelectronic device.

Referring now to FIG. 5, one example of an assembly 38 having an optoelectronic device 40 and an electronic device 41 is illustrated. Optoelectronic device 40 and electronic device 41 are illustrated as being physically separated by a channel 44 that extends to substrate 12. The two devices may be separated during the etching process as would be commonly known to those in the art. However, other means for electrically isolating one component from another such as ion implantation may be employed. Assembly 38 is coupled to a light source 42. Optoelectronic device 40 such as waveguide modulator 36 and electronic device 41 such as a double-heterojunction bipolar transistor 24 are illustrated. Waveguide modulator 36 and double-heterojunction bipolar transistor 24 may be fabricated according to the teachings above. Likewise, several devices may be fabricated adjacent to each other. The main limitation is the dimensions of the substrate on which the devices are fabricated.

In operation, the non-optical device such as that in FIG. 2 may be combined with the optical devices described above in FIGS. 3 and 4. The epitaxial layers would thus be fabricated simultaneously. In the case of a switched network or other device using multiple switches, the devices may all be fabricated on a single substrate.

While the best mode for carrying out the present invention has been described in detail, those familiar with the art to which this invention relates will recognize various alternative designs and embodiments for practicing the invention as defined by the following claims:

What is claimed is:

1. An optoelectronic device for receiving an optical signal having an optical wavelength comprising:
    a substrate;
    a first layer adjacent to said substrate;
    a second layer adjacent to said first layer, said second layer forming a selectively optically varying layer, so that said second layer is optically absorbing when a reverse bias is applied thereto and said second layer is optically transparent when a zero reverse bias is applied thereto;
    a third layer adjacent to said second layer; and
    a fourth layer adjacent to said third layer, said fourth layer being optically transparent layer.

2. A device as recited in claim 1 further comprising a fifth layer adjacent to said fourth layer.

3. A device as recited in claim 1 wherein the second layer and said third layer form an optical core of an optical device.

4. A device as recited in claim 1 wherein the first and fourth layers form a cladding of an optical device.

5. A device as recited in claim 1 wherein said first, second and fourth layers have a specific relation to the optical wavelength.

6. A device as recited in claim 1 wherein said second and third layers have a higher refractive index than the first and fourth layers.

7. A device as recited in claim 1 wherein said bandgap of said second layer is smaller than the bandgap of said first, third and fourth layers.

8. A device as recited in claim 1 wherein said first layer is optically transparent at the optical wavelength.

9. A device as recited in claim 1 wherein said second layer has a bandgap substantially determined by the energy on said optical signal.

10. A device as recited in claim 1 wherein said fourth layer is optically transparent at the optical wavelength.

11. A device as recited in claim 1 wherein said substrate is comprised of indium phosphide.

12. A device as recited in claim 1 wherein said first layer is an n-type layer; said second layer is an n-type layer; said third layer is a p-type layer; and said fourth layer is an n-type layer.

13. An assembly of an optoelectric device and an electronic device, the optoelectronic device having coupled to a light source having an optical wavelength, comprising:
    a substrate;
    a first layer adjacent said substrate, said first layer being separated into a first first layer portion and a second first layer portion;
    a second layer adjacent to said first layer, said second layer forming a selectively optically varying layer, so that said second layer is optically absorbing when a reverse bias is applied thereto and said second layer is optically transparent when a zero reverse bias is applied thereto; said second layer being separated into a first second layer portion and a second second layer portion;
    a third layer adjacent to said second layer; said third layer being separated into a first third layer portion and a second third layer portion;
    a fourth layer adjacent to said third layer, said fourth layer being optically transparent layer, said fourth layer being separated into a first fourth layer portion and a second fourth layer portion; and
    the electronic device including said substrate, said first first portion, said first second portion, said third first portion and said fourth first portion,
    the optoelectronic device having said substrate, said second first portion, said second second portion, said second third portion and said second fourth portion.

14. An assembly as recited in claim 13 further comprising a fifth layer adjacent to said fourth layer.

15. An assembly as recited in claim 13 wherein said second and third layers have a higher refractive index than the first and fourth layers.

16. A method of forming an epitaxial layer structure comprising the steps of:
    forming a first doped layer adjacent to the substrate, the first doped layer having a first refractive index;
    forming a second doped epitaxial layer adjacent to the first doped layer, the second doped forming a selectively optically varying layer, so that said second layer is optically absorbing when a reverse bias is applied thereto and said second layer is optically transparent when a zero reverse bias is applied thereto;
    forming a third doped epitaxial layer adjacent to the second layer, the third doped layer being a third refractive index;
    forming a fourth doped epitaxial layer adjacent to the third layer, the fourth doped layer having a fourth refractive index lower than the second refractive index.

17. A method as recited in claim 16 further comprising the steps of forming a fifth doped epitaxial layer adjacent to the fourth doped layer.

18. A method as recited in claim 16 further comprising the steps of separating said first, second, third and fourth doped layers into an electronic device and an optoelectronic device.

* * * * *